(12) United States Patent  
Narita

(10) Patent No.: US 10,388,780 B1  
(45) Date of Patent: Aug. 20, 2019

(54) SEMICONDUCTOR DEVICE

(71) Applicants: Kabushiki Kaisha Toshiba, Minato-ku (JP); Toshiba Electronic Devices & Storage Corporation, Minato-ku (JP)

(72) Inventor: Tomotaka Narita, Kofu (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/038,821

(22) Filed: Jul. 18, 2018

(30) Foreign Application Priority Data

Feb. 19, 2018 (JP) .................................. 2018-027180

(51) Int. Cl.
| | |
|---|---|
| H01L 29/78 | (2006.01) |
| H01L 29/423 | (2006.01) |
| H01L 29/08 | (2006.01) |
| H01L 29/267 | (2006.01) |
| H01L 29/417 | (2006.01) |

(52) U.S. Cl.
CPC .......... *H01L 29/78* (2013.01); *H01L 29/0847* (2013.01); *H01L 29/267* (2013.01); *H01L 29/41725* (2013.01); *H01L 29/4232* (2013.01); *H01L 29/4236* (2013.01); *H01L 29/7813* (2013.01); *H01L 29/7825* (2013.01)

(58) Field of Classification Search
CPC ............. H01L 29/4236; H01L 29/7825; H01L 29/7813
USPC ................................................ 257/278, 288
See application file for complete search history.

(56) References Cited

U.S. PATENT DOCUMENTS

| | | | |
|---|---|---|---|
| 5,350,709 | A | 9/1994 | Harada et al. |
| 10,096,703 | B2 * | 10/2018 | Harada ............... H01L 29/1095 |
| 2007/0001176 | A1 | 1/2007 | Ward, III et al. |
| 2010/0062599 | A1 | 3/2010 | Takano et al. |
| 2012/0273773 | A1 | 11/2012 | Ieda et al. |
| 2014/0061733 | A1 | 3/2014 | Schmidt et al. |
| 2014/0061871 | A1 | 3/2014 | Nagasawa |
| 2015/0349143 | A1 | 12/2015 | Inoue et al. |
| 2016/0155747 | A1 | 6/2016 | Mihara |

(Continued)

FOREIGN PATENT DOCUMENTS

| | | |
|---|---|---|
| DE | 10 2013 217 225 A1 | 3/2014 |
| JP | 3407926 | 5/2003 |

(Continued)

*Primary Examiner* — David Vu  
*Assistant Examiner* — Brandon C Fox  
(74) *Attorney, Agent, or Firm* — Oblon, McClelland, Maier & Neustadt, L.L.P.

(57) ABSTRACT

According to one embodiment, a semiconductor device includes a first electrode, a first semiconductor region of a first conductivity type, a second semiconductor region of a second conductivity type, a second electrode, and a first layer. The first layer includes at least one selected from the group consisting of silicon nitride, silicon oxide, and silicon oxynitride. The first layer includes a first portion, a second portion, and a third portion. The first portion is provided on the second electrode. The second portion is provided on the first portion. A content of silicon of the second portion is higher than a content of silicon of the first portion. A third portion is provided on the second portion. A content of silicon of the third portion is lower than the content of silicon of the second portion.

10 Claims, 9 Drawing Sheets

(56) References Cited

U.S. PATENT DOCUMENTS

2016/0211319 A1* 7/2016 Saito .................. H01L 29/7397
2016/0351384 A1   12/2016 Atkinson et al.
2018/0350900 A1* 12/2018 Nakamata ............. H01L 29/063

FOREIGN PATENT DOCUMENTS

| JP | 5195186 | 5/2013 |
| JP | 2015-228399 | 12/2015 |
| JP | 2016-103532 | 6/2016 |
| JP | 2016-184748 | 10/2016 |
| JP | 2017-17145 | 1/2017 |

* cited by examiner

SEMICONDUCTOR DEVICE

CROSS-REFERENCE TO RELATED APPLICATIONS

This application is based upon and claims the benefit of priority from Japanese Patent Application No. 2018-027180, filed on Feb. 19, 2018; the entire contents of which are incorporated herein by reference.

FIELD

Embodiments described herein relate generally to a semiconductor device.

BACKGROUND

A semiconductor device such as a diode, a MOSFET (Metal Oxide Semiconductor Field Effect Transistor), an IGBT (Insulated Gate Bipolar Transistor), or the like is used in applications of, for example, power control. High reliability of the semiconductor device is desirable.

DETAILED DESCRIPTION

Figure 1:
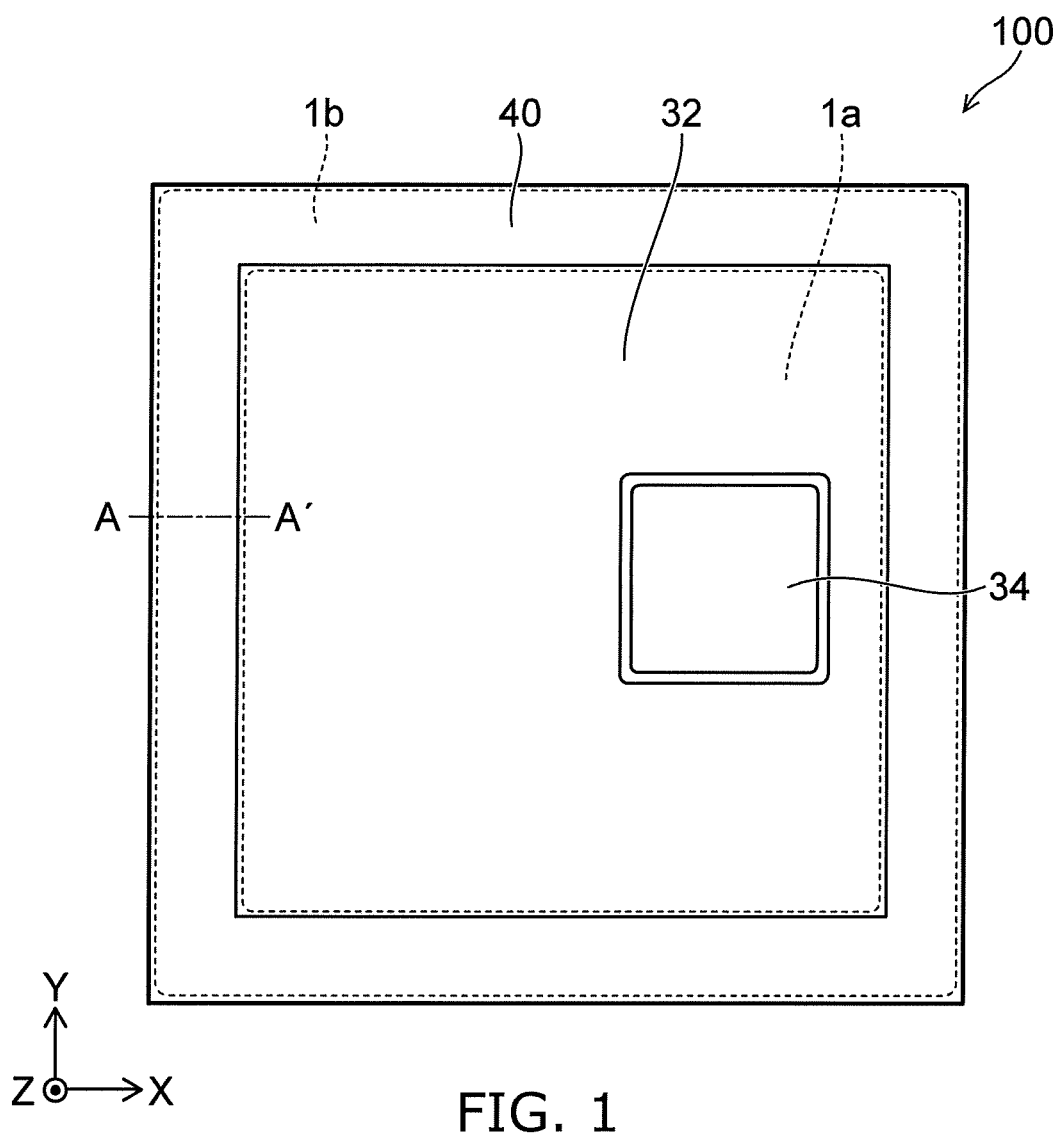
FIG. 1 is a plan view of the semiconductor device according to the first embodiment.

According to one embodiment, a semiconductor device includes a first electrode, a first semiconductor region of a first conductivity type, a second semiconductor region of a second conductivity type, a second electrode, and a first layer. The first semiconductor region is provided on the first electrode. The first semiconductor region includes a first region and a second region. The second region is provided around the first region. The second semiconductor region is provided on the first region. The second electrode includes a metal and is provided on the second semiconductor region. The first layer includes at least one selected from the group consisting of silicon nitride, silicon oxide, and silicon oxynitride. The first layer includes a first portion, a second portion, and a third portion. The first portion is provided on the second region. A portion of the first portion is positioned on the second electrode. The second portion is provided on the first portion. A content of silicon of the second portion is higher than a content of silicon of the first portion. A third portion is provided on the second portion. A content of silicon of the third portion is lower than the content of silicon of the second portion.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

In the following descriptions and drawings, notations of $n^+$, $n$, $n^-$ and $p^+$, $p$, $p^-$ represent relative height of an impurity concentration in conductive types. That is, the notation with "+" shows a relatively higher impurity concentration than an impurity concentration for the notation without any of "+" and "−". The notation with "−" shows a relatively lower impurity concentration than the impurity concentration for the notation without any of them.

The embodiments described below may be implemented by reversing the p-type and the n-type of the semiconductor regions.

First Embodiment

A semiconductor device 100 according to a first embodiment will now be described with reference to FIG. 1 and FIG. 2.

FIG. 1 is a plan view of the semiconductor device according to the first embodiment.

Figure 2:
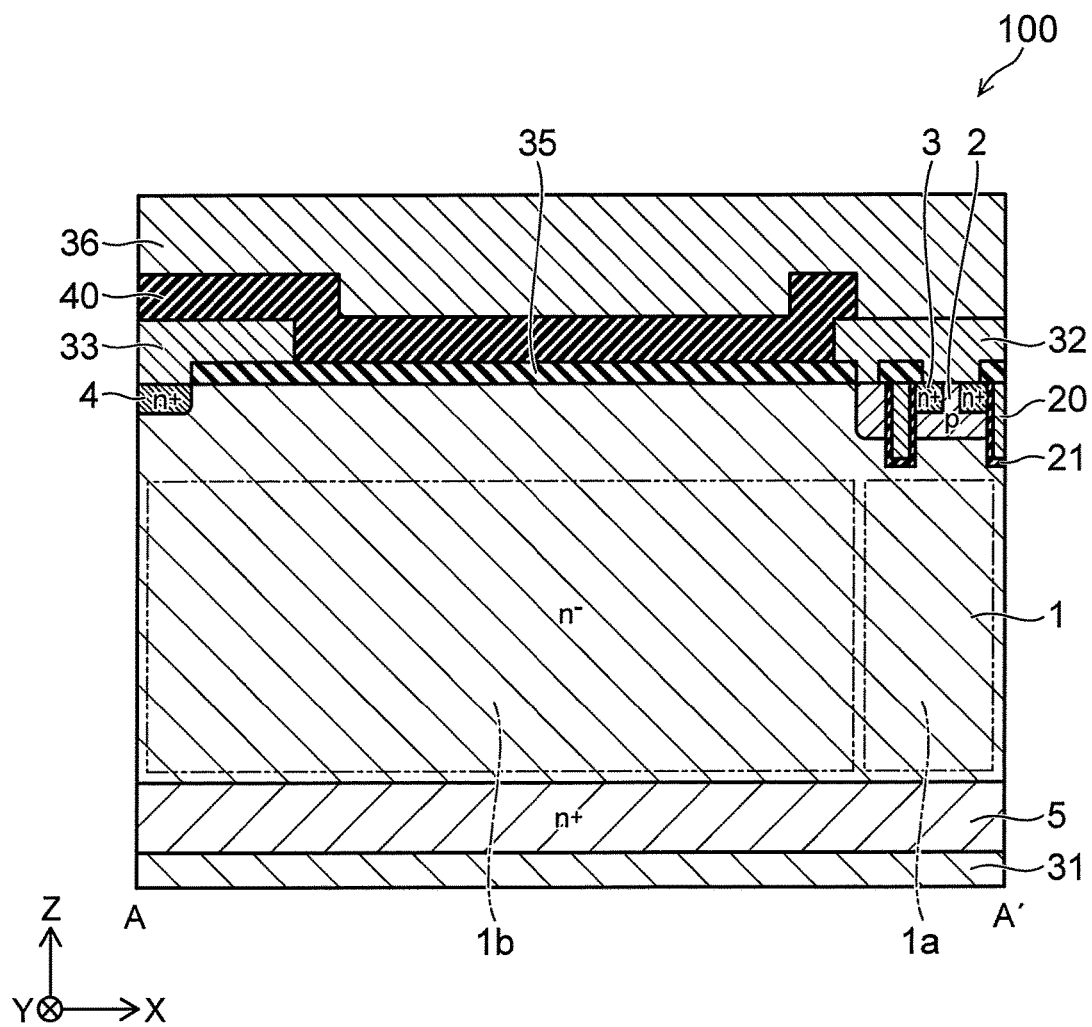
FIG. 2 is an A-A" cross-sectional view of FIG. 1.

FIG. 2 is an A-A" cross-sectional view of FIG. 1.

Figure 3:
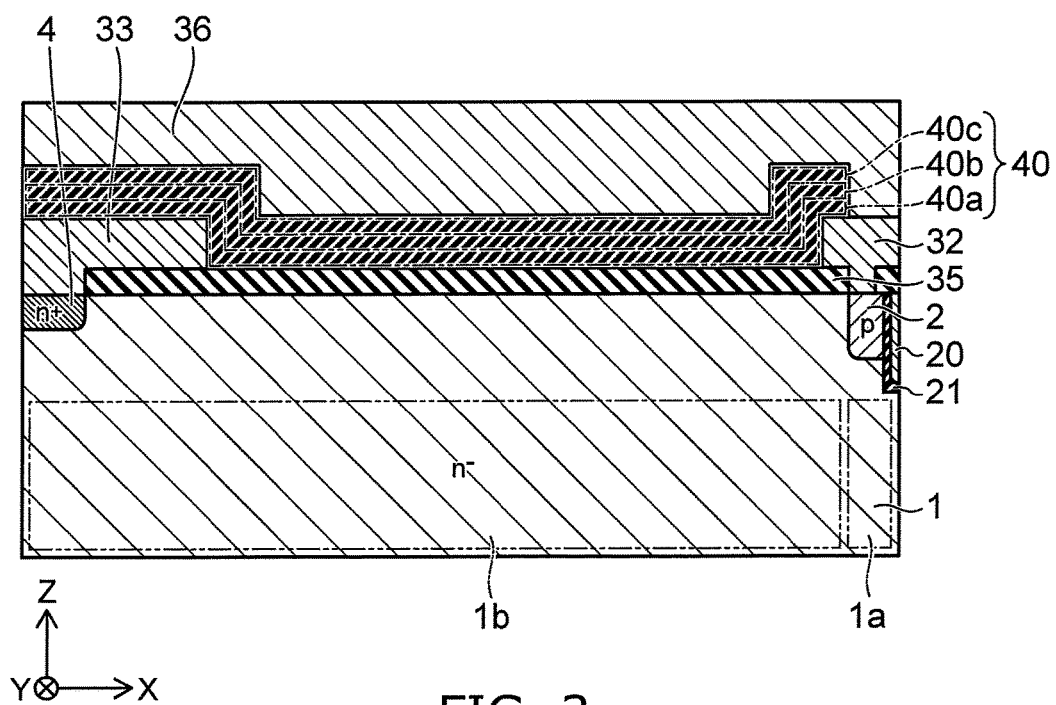
FIG. 3 is a cross-sectional view in which a portion of FIG. 2 is enlarged.

FIG. 3 is a cross-sectional view in which a portion of FIG. 2 is enlarged.

An insulating layer 36 is not illustrated in FIG. 1. In FIG. 1, a first region 1a and a second region 1b that are included in an $n^-$-type semiconductor region 1 are illustrated by broken lines.

The semiconductor device 100 is, for example, a MOSFET.

As illustrated in FIG. 1 and FIG. 2, the semiconductor device 100 includes an $n^-$-type (first conductivity-type) semiconductor region 1 (a first semiconductor region), a p-type (second conductivity-type) semiconductor region 2 (a second semiconductor region), an $n^+$-type source region 3 (a third semiconductor region), an $n^+$-type semiconductor region 4 (a fourth semiconductor region), an $n^+$-type semiconductor region 5, a gate electrode 20, a gate insulating layer 21, a first electrode 31 (a drain electrode), a second electrode 32 (a source electrode), a third electrode 33, a gate pad 34, an insulating layer 35, an insulating layer 36, and a first layer 40.

An XYZ orthogonal coordinate system is used in the description of the embodiments recited below. The direction from the first region 1a of the $n^-$-type semiconductor region 1 toward the p-type semiconductor region 2 is taken as a Z-direction. Two mutually-orthogonal directions perpendicular to the Z-direction are taken as an X-direction and a Y-direction. For the description, the direction from the first region 1a toward the p-type semiconductor region 2 is called "up;" and the reverse direction is called "down." These directions are based on the relative positional relationship between the first region 1a and the p-type semiconductor region 2 and are independent of the direction of gravity.

As illustrated in FIG. 1, the second electrode 32 and the gate pad 34 are provided at the upper surface of the semiconductor device 100. The second electrode 32 and the gate pad 34 are separated from each other and are surrounded with the first layer 40. The n⁻-type semiconductor region 1 includes the first region 1a, and the second region 1b provided around the first region 1a. The second electrode 32 and the gate pad 34 are provided on the first region 1a. The first layer 40 is provided on the second region 1b.

As illustrated in FIG. 2, the first electrode 31 is provided at the lower surface of the semiconductor device 100. The n⁺-type semiconductor region 5 is provided on the first electrode 31 and is electrically connected to the first electrode 31. The first region 1a and the second region 1b of the n⁻-type semiconductor region 1 are provided on the n⁺-type semiconductor region 5. The p-type semiconductor region 2 is provided on the first region 1a. The n⁺-type source region 3 is provided on at least a portion of the p-type semiconductor region 2.

In the X-direction, the gate electrode 20 opposes, with the gate insulating layer 21 interposed, the p-type semiconductor region 2, a portion of the n⁻-type semiconductor region 1, and at least a portion of the n⁺-type source region 3. The second electrode 32 is provided on the p-type semiconductor region 2, the n⁺-type source region 3, and the gate electrode 20. The second electrode 32 is electrically connected to the p-type semiconductor region 2 and the n⁺-type source region 3. The insulating layer 35 is provided between the gate electrode 20 and the second electrode 32. The gate electrode 20 is electrically isolated from the second electrode 32.

The n⁺-type semiconductor region 4 is positioned on the second region 1b and is provided around the p-type semiconductor region 2. The n⁺-type semiconductor region 4 is separated from the p-type semiconductor region 2 in the X-direction and the Y-direction. The third electrode 33 is provided on the n⁺-type semiconductor region 4 and is electrically connected to the n⁺-type semiconductor region 4. The third electrode 33 is separated from the second electrode 32 in the X-direction and the Y-direction.

The first layer 40 is provided on the second region 1b. A portion of the first layer 40 is provided on the second electrode 32. Another portion of the first layer 40 is provided on the third electrode 33. Yet another portion of the first layer 40 is provided on the insulating layer 35. The yet another portion of the first layer 40 is positioned between the second electrode 32 and the third electrode 33 in the X-direction and the Y-direction. The insulating layer 36 is provided at the outer perimeter of the second electrode 32 and on the first layer 40.

Examples of the materials of the components of the semiconductor device 100 will now be described.

The n⁻-type semiconductor region 1, the p-type semiconductor region 2, the n⁺-type source region 3, the n⁺-type semiconductor region 4, and the n⁺-type semiconductor region 5 include silicon, silicon carbide, gallium nitride, or gallium arsenide as a semiconductor material. In the case where silicon is used as the semiconductor material, arsenic, phosphorus, or antimony may be used as the n-type impurity. Boron may be used as the p-type impurity.

The gate electrode 20 includes a conductive material such as polysilicon, etc.

The gate insulating layer 21 and the insulating layer 35 include an insulating material such as silicon oxide, etc.

The first electrode 31, the second electrode 32, the third electrode 33, and the gate pad 34 include a metal such as aluminum, etc. The second electrode 32 and the first electrode 31 may further include silicon.

The insulating layer 36 includes an insulating resin such as polyimide, etc.

The first layer 40 includes silicon. For example, the first layer 40 includes at least one selected from the group consisting of silicon nitride, silicon oxide, and silicon oxynitride. The electrical resistance of the first layer 40 is higher than the electrical resistances of the second region 1b, the second electrode 32, and the third electrode 33.

As illustrated in FIG. 3, the first layer 40 includes a first portion 40a, a second portion 40b, and a third portion 40c. The first portion 40a is provided on the second region 1b. A portion of the first portion 40a is provided on the second electrode 32; and another portion of the first portion 40a is provided on the third electrode 33. The second portion 40b is provided on the first portion 40a. The third portion 40c is provided on the second portion 40b.

The content of silicon in the second portion 40b is more than the content of silicon in the first portion 40a. The content of silicon in the third portion 40c is less than the content of silicon in the second portion 40b. Therefore, the electrical resistance of the second portion 40b is lower than the electrical resistances of the first portion 40a and the third portion 40c. As an entirety, the electrical resistance of the first layer 40 is, for example, not less than $5.0 \times 10^8$ Ωcm and not more than $1.0 \times 10^{13}$ Ωcm.

Operations of the semiconductor device 100 will now be described.

When a voltage that is a threshold or more is applied to the gate electrode 20 in a state in which a voltage that is positive with respect to the second electrode 32 is applied to the first electrode 31, a channel (an inversion layer) is formed at the gate insulating layer 21 vicinity of the p-type semiconductor region 2; and the semiconductor device 100 is set to an on-state. Electrons pass through the channel and flow from the second electrode 32 toward the first electrode 31. Subsequently, when the voltage that is applied to the gate electrode 20 becomes lower than the threshold, the channel in the p-type semiconductor region 2 disappears; and the semiconductor device 100 is set to an off-state.

When the semiconductor device 100 is in the off-state, the potentials of the n⁺-type semiconductor region 4 and the third electrode 33 are, for example, the same as the potential of the first electrode 31. In other words, the potential of the third electrode 33 is higher than the potential of the second electrode 32. Therefore, a micro current flows through the first layer 40 from the third electrode 33 to the second electrode 32. More specifically, the current flows mainly in the second portion 40b which has a relatively high content of silicon. By the micro current flowing through the first layer 40, the potential at each point of the first layer 40 decreases gradually from the third electrode 33 toward the second electrode 32. The movement of ions toward the n⁻-type semiconductor region 1 from the insulating layer 36 and/or from outside the semiconductor device 100 is blocked by the first layer 40. By these effects, the bias of the electric field distribution in the second region 1b of the n⁻-type semiconductor region 1 is relaxed; and the breakdown voltage can be increased.

An example of a method for manufacturing the semiconductor device 100 will now be described with reference to FIG. 4A to FIG. 6B.

FIG. 4A to FIG. 6B are process cross-sectional views illustrating manufacturing processes of the semiconductor device according to the first embodiment.

Figure 4A:
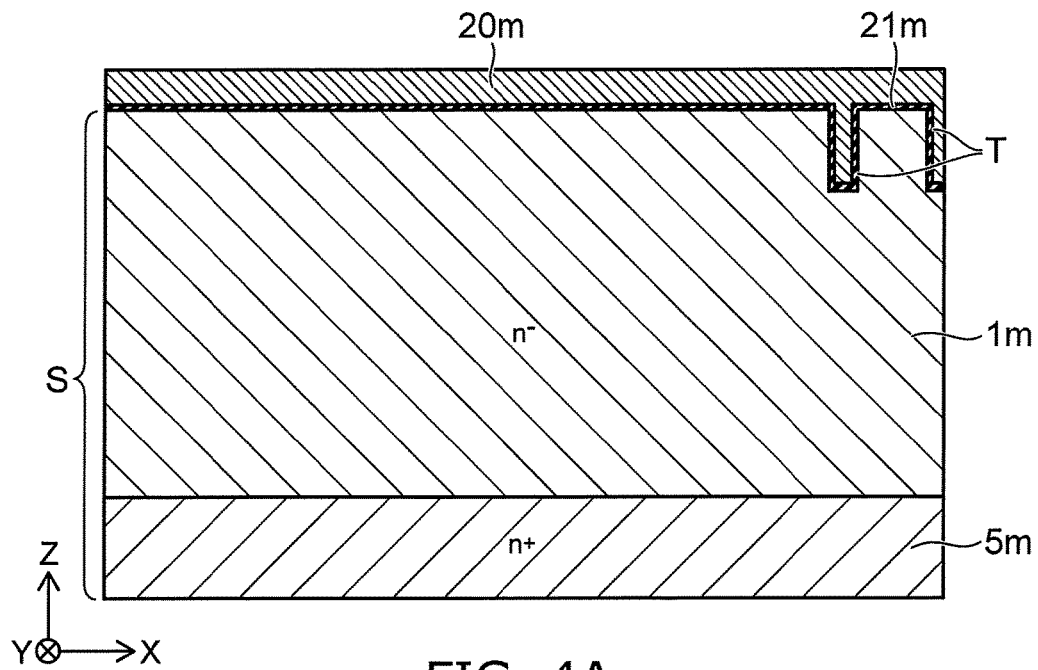
FIG. 4A to FIG. 6B are process cross-sectional views illustrating manufacturing processes of the semiconductor device according to the first embodiment.

First, a semiconductor substrate S that includes an n⁺-type semiconductor region 5m and an n⁻-type semiconductor region 1m is prepared. Multiple trenches T are formed in the n⁻-type semiconductor region 1m by using photolithography and RIE (Reactive Ion Etching). An insulating layer 21m is formed along the upper surface of the n⁻-type semiconductor region 1 and the inner walls of the trenches T by thermal oxidation of the semiconductor substrate S. As illustrated in FIG. 4A, a conductive layer 20m that fills the multiple trenches T is formed on the insulating layer 21m by using CVD (Chemical Vapor Deposition).

Figure 4B:
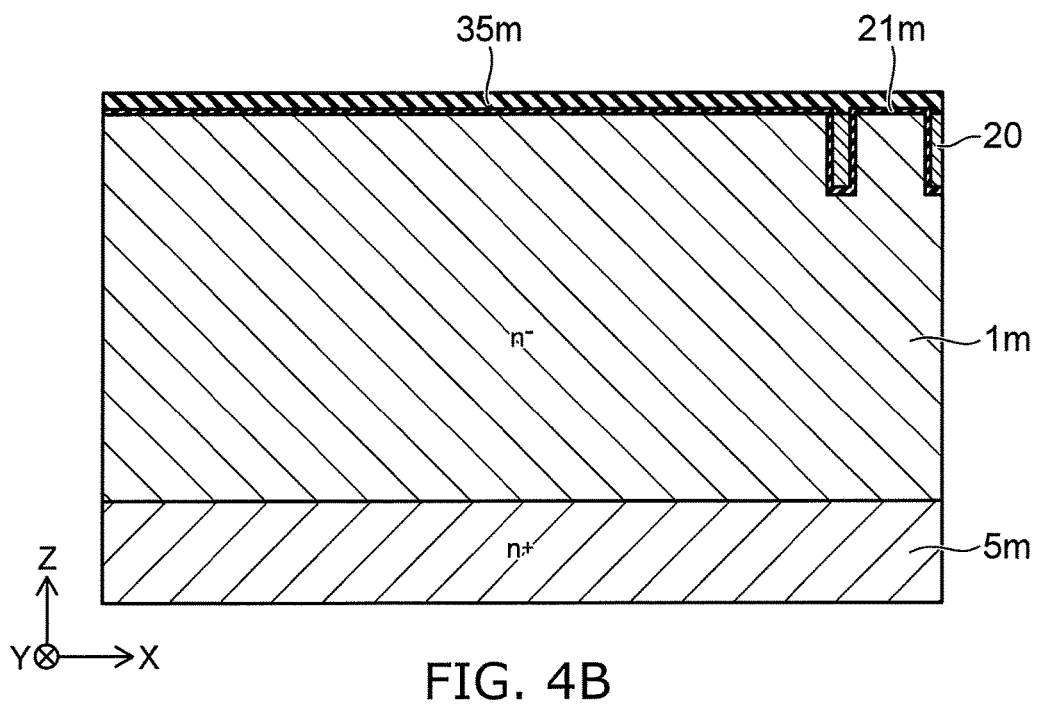

The conductive layer 20m is divided into the multiple gate electrodes 20 by removing a portion of the conductive layer 20m. The multiple gate electrodes 20 are provided respectively inside the multiple trenches T. An insulating layer 35m is formed on the n⁻-type semiconductor region 1 and on the gate electrodes 20 as illustrated in FIG. 4B by using CVD.

Figure 5A:
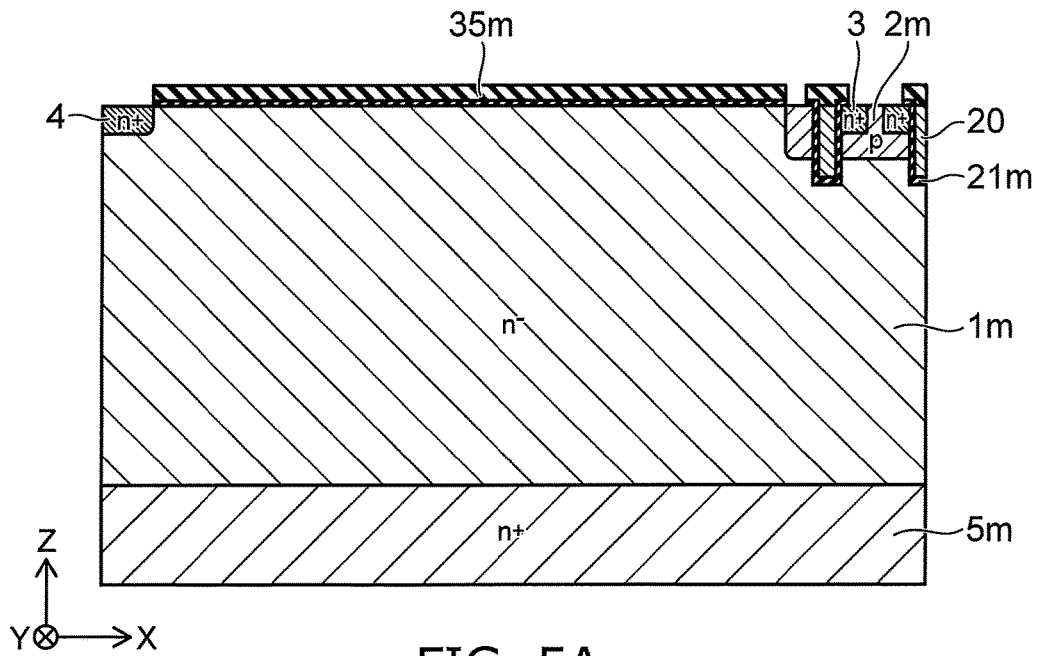

Then, the insulating layer 21m and the insulating layer 35m are patterned. Thereby, the upper surface of the n⁻-type semiconductor region 1m between the trenches T and the upper surface of the outer perimeter of the n⁻-type semiconductor region 1m are exposed. A p-type semiconductor region 2m is formed by ion implantation of a p-type impurity into the upper surface of the n⁻-type semiconductor region 1 between the trenches T. The n⁺-type source region 3 and the n⁺-type semiconductor region 4 are formed respectively in the upper surface of the p-type semiconductor region 2m and the upper surface of the outer perimeter of the n⁻-type semiconductor region inn as illustrated in FIG. 5A by ion implantation of an n-type impurity.

Figure 5B:
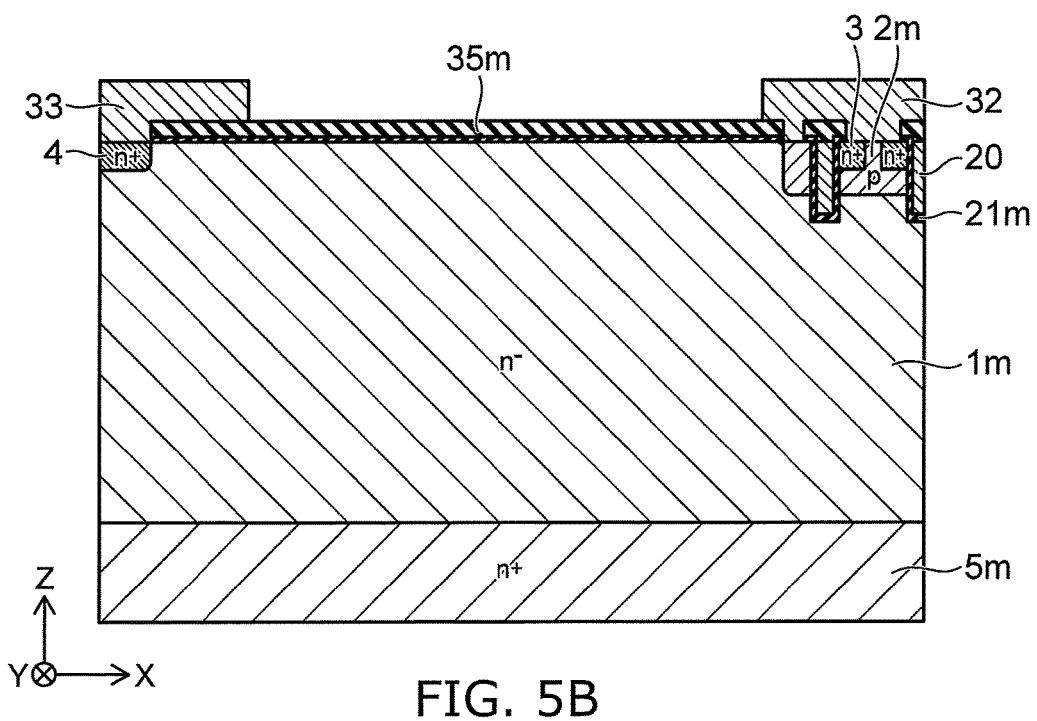

A metal layer is formed on the p-type semiconductor region 2, the n⁺-type source region 3, the n⁺-type semiconductor region 4, and the insulating layer 35m by using sputtering. The second electrode 32, the third electrode 33, and the not-illustrated gate pad 34 are formed as illustrated in FIG. 5B by patterning the metal layer.

A silicon nitride layer that covers the second electrode 32 and the third electrode 33 is formed using plasma CVD using a silicon-containing gas and a nitrogen-containing gas. Specifically, first, the proportion of the content of silicon to the content of nitrogen is set to a first proportion; and film formation is performed. Then, the proportion of the content of silicon to the content of nitrogen is set to a second proportion; and film formation is performed. The second proportion is larger than the first proportion. Then, the proportion of the content of silicon to the content of nitrogen is set to a third proportion; and film formation is performed. The third proportion is smaller than the second proportion. Thereby, the proportion of the content of silicon to the content of nitrogen changes in the thickness direction of the silicon nitride layer; and regions that correspond to the first to third portions 40a to 40c are formed. The proportions may change continuously in the film formation or may be changed in a step configuration.

Figure 6A:
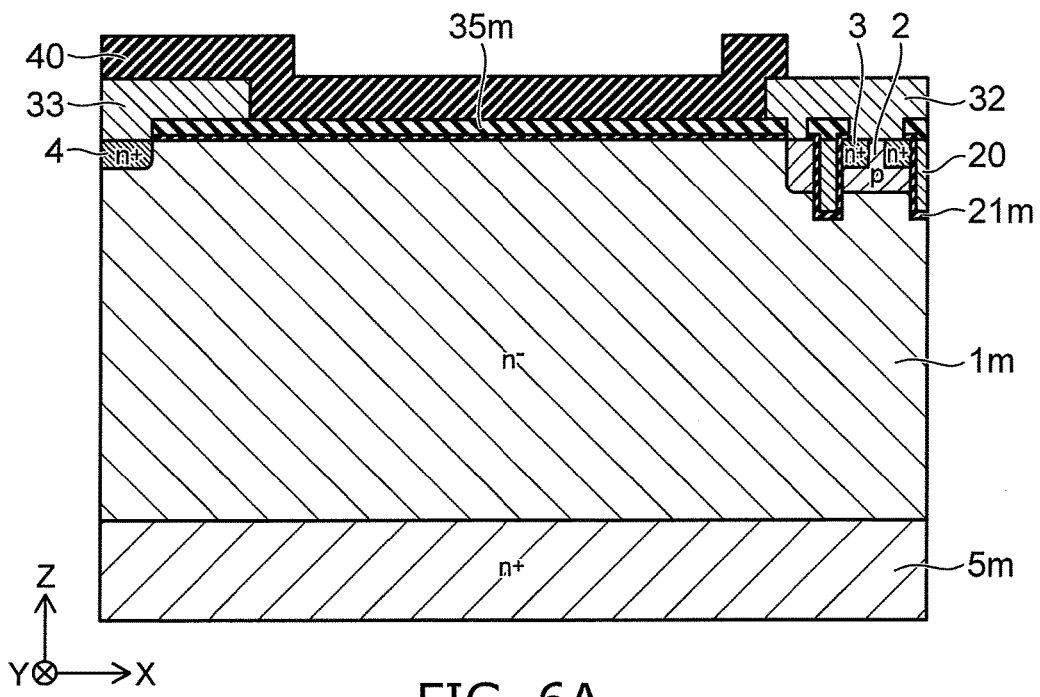

Heat treatment of the silicon nitride layer may be performed after forming the silicon nitride layer. Thereby, the silicon that is included in the silicon nitride layer is diffused in the thickness direction. In the heat treatment, a temperature (e.g., 450 degrees) that is higher than the film formation temperature (e.g., 400 degrees) of the plasma CVD is applied to the semiconductor substrate S. By patterning the silicon nitride layer, the first layer 40 that covers the outer perimeter of the second electrode 32 and the third electrode 33 is formed as illustrated in FIG. 6A.

Figure 6B:
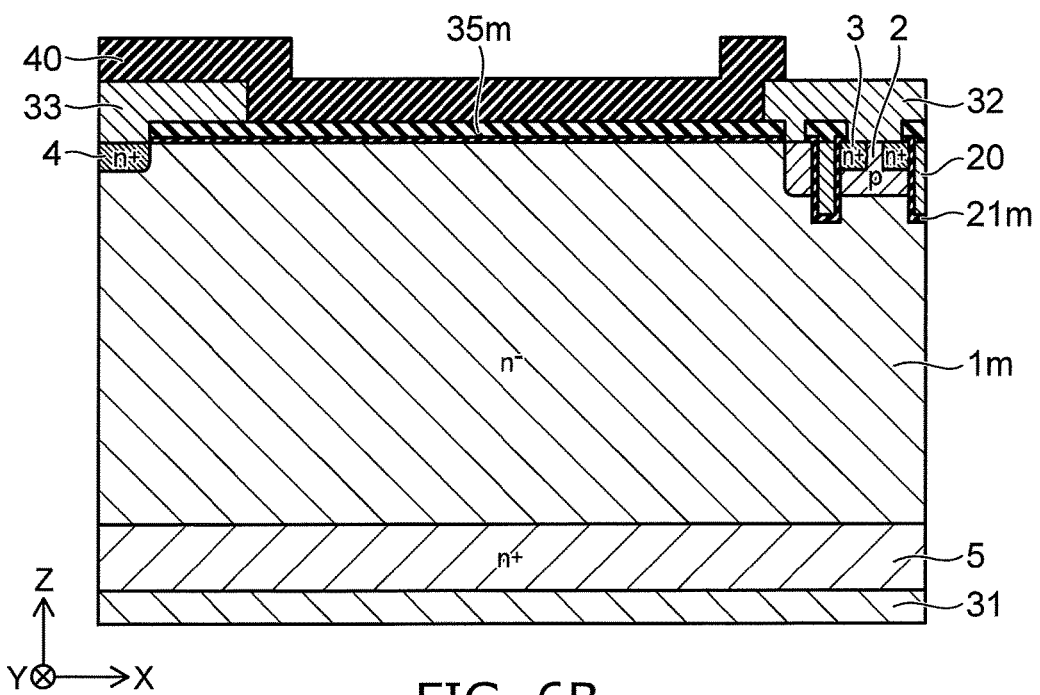

The lower surface of the n⁺-type semiconductor region 5m is polished until the n⁺-type semiconductor region 5m has a prescribed thickness. As illustrated in FIG. 6B, the first electrode 31 is formed under the n⁺-type semiconductor region 5 by using sputtering. Subsequently, the semiconductor device 100 illustrated in FIG. 1 to FIG. 3 is manufactured by forming the insulating layer 36 covering the outer perimeter of the second electrode 32, the outer perimeter of the gate pad 34, and the first layer 40.

Effects of the first embodiment will now be described.

As described above, a current flows in the second portion 40b of the first layer 40 when the semiconductor device 100 is in the off-state. Thereby, the breakdown voltage of the semiconductor device 100 can be increased. Also, the first portion 40a that has a relatively low content of silicon is provided between the second electrode 32 and the second portion 40b. Thereby, a reaction between the metal (e.g., aluminum) included in the second electrode 32 and the silicon included in the second portion 40b can be suppressed. The diffusion of the metal included in the second electrode 32 into the second portion 40b can be suppressed. Thereby, the occurrence of electrical disconnections of the second electrode 32, the fluctuation of the electrical characteristics of the second electrode 32, etc., can be suppressed.

On the other hand, the permeability of the first portion 40a to moisture is lower than the permeability of the second portion 40b to moisture. Therefore, by providing the first portion 40a, the movement of moisture toward the semiconductor regions from the insulating layer 36 and from outside the semiconductor device 100 is blocked by the first portion 40a. The moisture that does not pass through the first portion 40a collects in the second portion 40b. Further, the hygroscopicity of a layer including silicon increases as the content of silicon increases. Therefore, the hygroscopicity of the second portion 40b is higher than the hygroscopicity of the first portion 40a.

In other words, by providing the first portion 40a, reactions between the second portion 40b and moisture are promoted; and the characteristics (e.g., the electrical resistance) of the second portion 40b fluctuate easily. In the case where the electrical resistance of the second portion 40b changes, there is a possibility that how the depletion layer spreads in the second region 1b may change; and the breakdown voltage of the semiconductor device may decrease.

Because of this problem, the first layer 40 further includes the third portion 40c in the semiconductor device 100 according to the embodiment. The content of silicon in the third portion 40c is less than the content of silicon in the second portion 40b. Therefore, the movement of the moisture toward the second portion 40b can be blocked by the third portion 40c.

In other words, according to the embodiment, the fluctuation of the characteristics of the second portion 40b can be suppressed while suppressing the reaction between the second electrode 32 and the first layer 40. The reliability of the semiconductor device 100 can be increased.

In silicon nitride, the permeability to moisture decreases as the proportion of the content of silicon to the content of nitrogen approaches 0.75 which is the stoichiometric ratio. As the proportion approaches 0.75, the reaction between the silicon and the metal included in the second electrode 32 can be suppressed. Also, the electrical resistance of the silicon nitride layer decreases as the proportion increases.

Accordingly, it is desirable for the proportion $C3_{Si}/C3_N$ of the content $C3_{Si}$ of silicon to the content $C3_N$ of nitrogen in the third portion 40c to be nearer to the stoichiometric ratio (0.75) of silicon nitride than is the proportion $C2_{Si}/C2_N$ of the content $C2_{Si}$ of silicon to the content $C2_N$ of nitrogen in the second portion 40b. Similarly, it is desirable for the proportion $C1_{Si}/C1_N$ of the content $C1_{Si}$ of silicon to the content $C1_N$ of nitrogen in the first portion 40a to be nearer to 0.75 than is the proportion $C2_{Si}/C2_N$.

In other words, it is desirable for the absolute value of the difference between the proportion $C1_{Si}/C1_N$ and 0.75 (the stoichiometric ratio) to be less than the absolute value of the difference between the proportion $C2_{Si}/C2_N$ and 0.75. It is desirable for the absolute value of the difference between the proportion $C3_{Si}/C3_N$ and 0.75 to be less than the absolute value of the difference between the proportion $C2_{Si}/C2_N$ and 0.75.

It is desirable for the thickness of the first portion 40a to be not less than 10 nm and not more than 100 nm. It is desirable for the thickness of the second portion 40b to be not less than 100 nm and not more than 600 nm. It is desirable for the thickness of the third portion 40c to be not less than 10 nm and not more than 100 nm.

For example, when analyzing the composition of the first layer 40 in the thickness direction for the first to third portions 40a to 40c, the vicinity of the portion where the peak of the proportion of the content of silicon to the content of nitrogen is detected corresponds to the second portion 40b. The portions that are lower and higher than the second portion 40b in the first layer 40 correspond respectively to the first portion 40a and the third portion 40c.

For example, the proportion $C1_{Si}/C1_N$ and the proportion $C3_{Si}/C3_N$ each are not less than 0.7 and not more than 0.95. The proportion $C2_{Si}/C2_N$ is not less than 1.0 and not more than 1.5.

In the case where the first layer 40 includes silicon nitride and has the composition described above, the refractive indexes of the first portion 40a and the third portion 40c are lower than the refractive index of the second portion 40b. For example, the refractive indexes of the first portion 40a and the third portion 40c are not less than 1.9 and not more than 2.1. The refractive index of the second portion 40b is not less than 2.3 and not more than 2.7.

The problems described above also may occur between the third electrode 33 and the first layer 40. Accordingly, it is desirable for the first to third portions 40a to 40c to be provided not only on the second electrode 32 but also on the third electrode 33.

Modification

Figure 7:
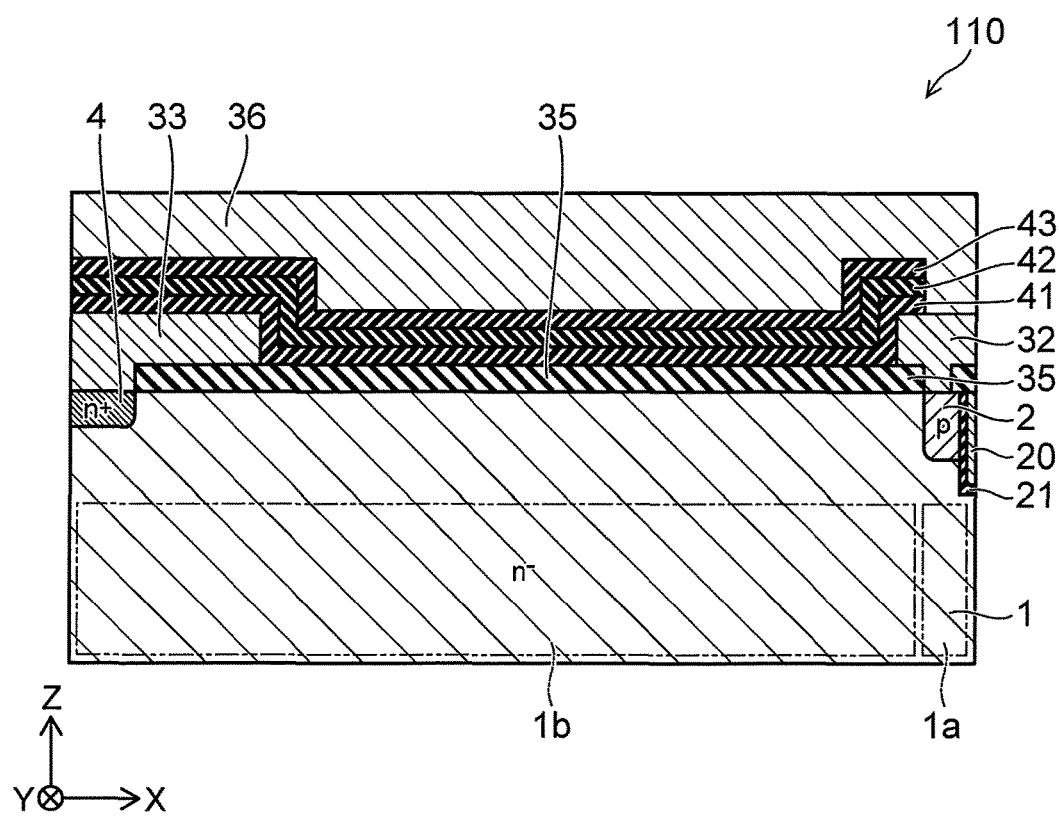
FIG. 7 is a cross-sectional view illustrating a portion of a semiconductor device according to a modification of the first embodiment.

FIG. 7 is a cross-sectional view illustrating a portion of a semiconductor device according to a modification of the first embodiment.

The semiconductor device 110 differs from the semiconductor device 100 in that a first layer 41, a second layer 42, and a third layer 43 are included instead of the first layer 40.

As illustrated in FIG. 7, the first layer 41 is provided on the second region 1b. A portion of the first layer 41 is provided on the second electrode 32. Another portion of the first layer 41 is provided on the third electrode 33. The second layer 42 is provided on the first layer 41. The third layer 43 is provided on the second layer 42.

The first to third layers 41 to 43 include at least one selected from the group consisting of silicon nitride, silicon oxide, and silicon oxynitride. As an entirety, the electrical resistance of the first to third layers 41 to 43 is, for example, not less than $5.0 \times 10^8$ Ωcm and not more than $1.0 \times 10^{13}$ Ωcm.

In the case where the first to third layers 41 to 43 include silicon nitride, for example, the compositions of the first to third layers 41 to 43 correspond to the compositions of the first to third portions 40a to 40c.

In other words, it is desirable for the difference between 0.75 and the proportion $C3_{Si}/C3_N$ of the content $C3_{Si}$ of silicon to the content $C3_N$ of nitrogen in the third layer 43 to be smaller than the difference between 0.75 and the proportion $C2_{Si}/C2_N$ of the content $C2_{Si}$ of silicon to the content $C2_N$ of nitrogen in the second layer 42. It is desirable for the difference between 0.75 and the proportion $C1_{Si}/C1_N$ of the content $C1_{Si}$ of silicon to the content $C1_N$ of nitrogen in the first layer 41 to be smaller than the difference between 0.75 and the proportion $C2_{Si}/C2_N$ of the content $C2_{Si}$ of silicon to the content $C2_N$ of nitrogen in the second layer 42.

For example, the proportion $C1_{Si}/C1_N$ and the proportion $C3_{Si}/C3_N$ each are not less than 0.7 and not more than 0.95. The proportion $C2_{Si}/C2_N$ is not less than 1.0 and not more than 1.5.

It is desirable for the thickness of the first layer 41 to be not less than 10 nm and not more than 100 nm. It is desirable for the thickness of the second layer 42 to be not less than 100 nm and not more than 600 nm. It is desirable for the thickness of the third layer 43 to be not less than 10 nm and not more than 100 nm.

In the semiconductor device 110 according to the modification as well, similarly to the semiconductor device 100, the change of the characteristics of the second layer 42 due to moisture can be suppressed; and the reliability can be increased.

Second Embodiment

Figure 8:
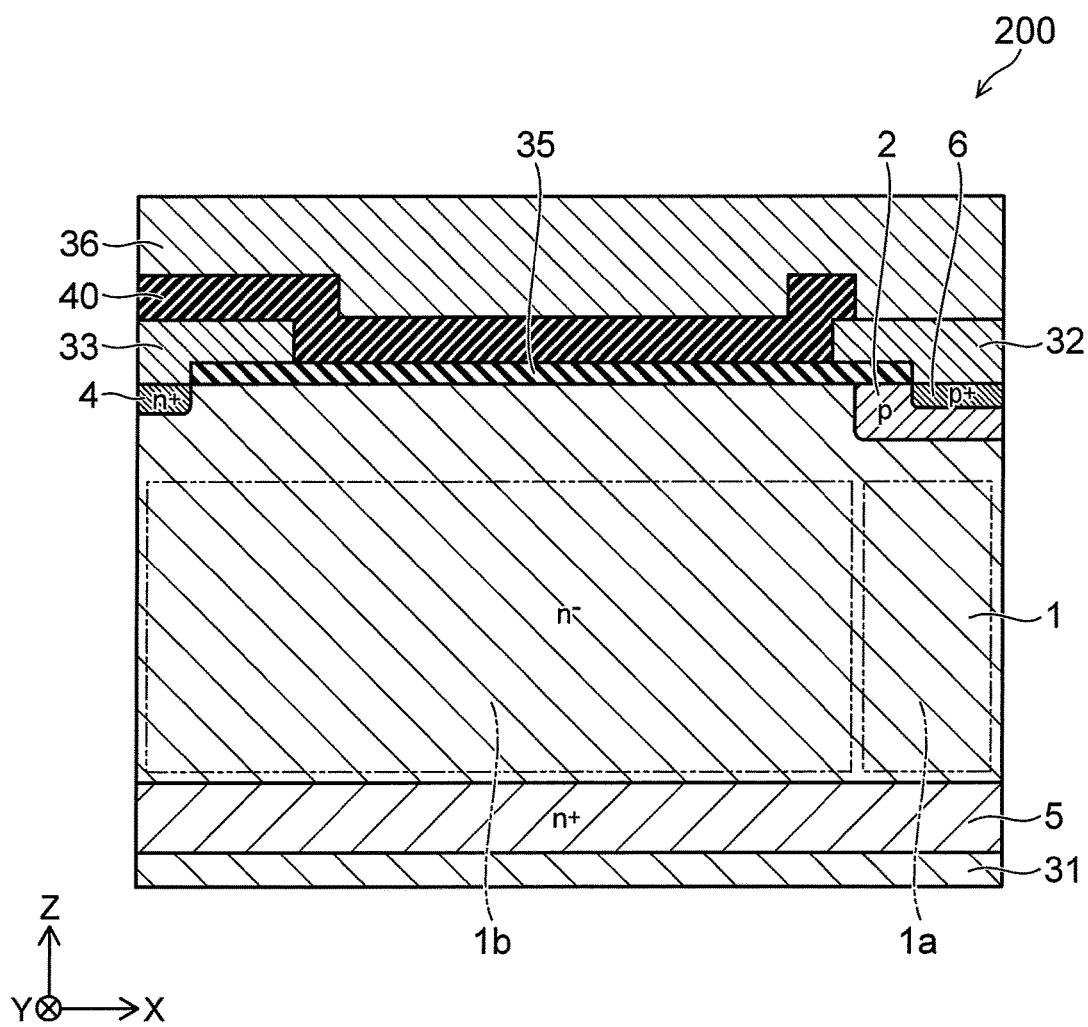
FIG. 8 is a cross-sectional view illustrating a portion of a semiconductor device according to a second embodiment.

FIG. 8 is a cross-sectional view illustrating a portion of a semiconductor device according to a second embodiment.

The semiconductor device 200 is, for example, a diode.

As illustrated in FIG. 8, compared to the semiconductor device 100, the semiconductor device 200 does not include the $n^+$-type source region 3, the gate electrodes 20, and the gate insulating layer 21. The semiconductor device 200 further includes, for example, a $p^+$-type anode region 6. In the semiconductor device 200, the first electrode 31 is used as a cathode electrode. The second electrode 32 is used as an anode electrode.

The $p^+$-type anode region 6 is provided selectively on the p-type semiconductor region 2. The second electrode 32 is provided on the $p^+$-type anode region 6 and is electrically connected to the $p^+$-type anode region 6.

In the embodiment as well, similarly to the first embodiment, the reliability of the semiconductor device 200 can be increased by providing the first layer 40. Similarly to the semiconductor device 110, the first to third layers 41 to 43 may be provided instead of the first layer 40 in the semiconductor device 200.

Third Embodiment

Figure 9:
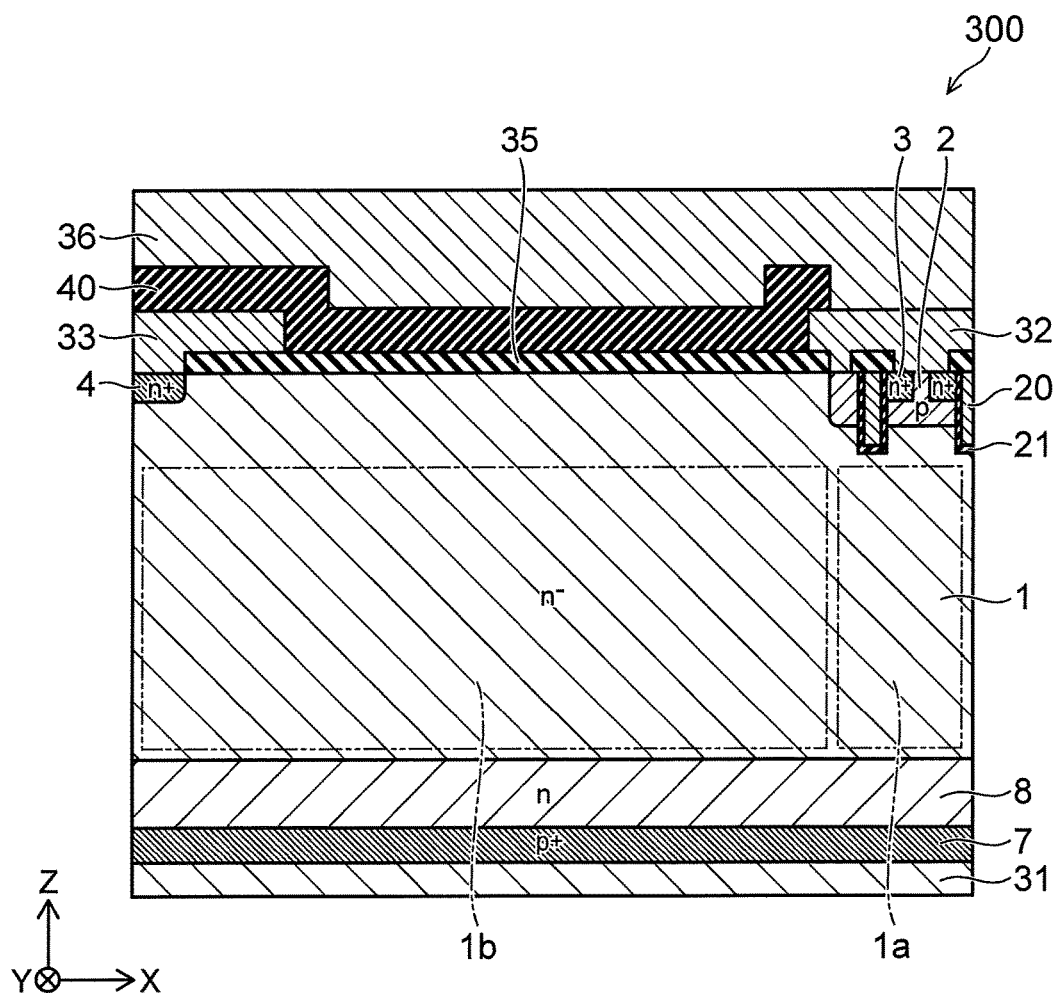
FIG. 9 is a cross-sectional view illustrating a portion of a semiconductor device according to a third embodiment.

FIG. 9 is a cross-sectional view illustrating a portion of a semiconductor device according to a third embodiment.

The semiconductor device 300 is, for example, an IGBT (Insulated Gate Bipolar Transistor).

As illustrated in FIG. 9, compared to the semiconductor device 100, the semiconductor device 300 includes a $p^+$-type collector region 7 and an n-type buffer region 8 instead of the $n^+$-type semiconductor region 5. The $p^+$-type collector region 7 is provided between the first electrode 31 and the $n^-$-type semiconductor region 1 and is electrically connected to the first electrode 31. The n-type buffer region 8 is provided between the $p^+$-type collector region 7 and the $n^-$-type semiconductor region 1. The first electrode 31 is used as a collector electrode; and the second electrode 32 is used as an emitter electrode.

In the embodiment as well, similarly to the first embodiment, the reliability of the semiconductor device 300 can be increased by providing the first layer 40. Similarly to the semiconductor device 110, the first to third layers 41 to 43 may be provided instead of the first layer 40 in the semiconductor device 300.

In each of the embodiments described above, it is possible to confirm the relative levels of the impurity concentrations between the semiconductor regions by using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM.

It is possible to measure the impurity concentration in each semiconductor region by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

Moreover, above-mentioned embodiments can be combined mutually and can be carried out.

What is claimed is:

1. A semiconductor device, comprising:
a first electrode;
a first semiconductor region provided on the first electrode, the first semiconductor region being of a first conductivity type and including a first region and a second region, the second region being provided around the first region;
a second semiconductor region provided on the first region, the second semiconductor region being of a second conductivity type;
a second electrode including a metal and being provided on the second semiconductor region; and
a first layer including at least one selected from the group consisting of silicon nitride, silicon oxide, and silicon oxynitride, the first layer including
a first portion provided on the second region, a portion of the first portion being positioned on the second electrode,
a second portion provided on the first portion, a content of silicon of the second portion being higher than a content of silicon of the first portion, and
a third portion provided on the second portion, a content of silicon of the third portion being lower than the content of silicon of the second portion.

2. The device according to claim 1, further comprising:
a fourth semiconductor region provided on the second region, the fourth semiconductor region being of the first conductivity type; and
a third electrode provided on the fourth semiconductor region,
the fourth semiconductor region being provided around the second semiconductor region and separated from the second semiconductor region,
an impurity concentration of the first conductivity type in the fourth semiconductor region being higher than an impurity concentration of the first conductivity type in the first semiconductor region,
the third electrode being separated from the second electrode,
another portion of the first portion being provided on the third electrode.

3. The device according to claim 1, wherein
the first layer includes silicon nitride,
an absolute value of a difference between 0.75 and a proportion of a content of silicon to a content of nitrogen in the first portion is less than an absolute value of a difference between 0.75 and a proportion of a content of silicon to a content of nitrogen in the second portion, and
an absolute value of a difference between 0.75 and a proportion of a content of silicon to a content of nitrogen in the third portion is less than the absolute value of the difference between 0.75 and the proportion of the content of silicon to the content of nitrogen in the second portion.

4. The device according to claim 1, wherein
the first layer includes silicon nitride,
a proportion of a content of silicon to a content of nitrogen in the second portion is not less than 1.0 and not more than 1.5, and
a proportion of a content of silicon to a content of nitrogen in the third portion is not less than 0.7 and not more than 0.95.

5. The device according to claim 1, further comprising:
a third semiconductor region provided on the second semiconductor region, the third semiconductor region being of the first conductivity type; and
a gate electrode, the gate electrode opposing, with a gate insulating layer interposed, the second semiconductor region, a portion of the first semiconductor region, and at least a portion of the third semiconductor region.

6. A semiconductor device, comprising:
a first electrode;
a first semiconductor region provided on the first electrode, the first semiconductor region being of a first conductivity type and including a first region and a second region, the second region being provided around the first region;
a second semiconductor region provided on the first region, the second semiconductor region being of a second conductivity type;
a second electrode including a metal and being provided on the second semiconductor region;
a first layer provided on the second region, a portion of the first layer being positioned on the second electrode, the first layer including at least one selected from the group consisting of silicon nitride, silicon oxide, and silicon oxynitride;
a second layer provided on the first layer, the second layer including at least one selected from the group consisting of silicon nitride, silicon oxide, and silicon oxynitride, a content of silicon in the second layer being more than a content of silicon in the first layer; and
a third layer provided on the second layer, the third layer including at least one selected from the group consisting of silicon nitride, silicon oxide, and silicon oxynitride, a content of silicon in the third layer being less than the content of silicon in the second layer.

7. The device according to claim 6, further comprising:
a fourth semiconductor region provided on the second region, the fourth semiconductor region being of the first conductivity type; and
a third electrode provided on the fourth semiconductor region,
the fourth semiconductor region being provided around the second semiconductor region and being separated from the second semiconductor region,
an impurity concentration of the first conductivity type in the fourth semiconductor region being higher than an impurity concentration of the first conductivity type in the first semiconductor region, the third electrode being separated from the second electrode, another portion of the first layer being provided on the third electrode.

8. The device according to claim 6, wherein the first layer, the second layer, and the third layer include silicon nitride, an absolute value of a difference between 0.75 and a proportion of a content of silicon to a content of nitrogen in the first layer is less than an absolute value of a difference between 0.75 and a proportion of a content of silicon to a content of nitrogen in the second layer, and an absolute value of a difference between 0.75 and a proportion of a content of silicon to a content of nitrogen in the third layer is less than the absolute value of the difference between 0.75 and the proportion of the content of silicon to the content of nitrogen in the second layer.

9. The device according to claim 6, wherein the first layer, the second layer, and the third layer include silicon nitride, a proportion of a content of silicon to a content of nitrogen in the second layer is not less than 1.0 and not more than 1.5, and a proportion of a content of silicon to a content of nitrogen in the third layer is not less than 0.7 and not more than 0.95.

10. The device according to claim 6, further comprising:

a third semiconductor region provided on the second semiconductor region, the third semiconductor region being of the first conductivity type; and a gate electrode, the gate electrode opposing, with a gate insulating layer interposed, the second semiconductor region, a portion of the first semiconductor region, and at least a portion of the third semiconductor region.

* * * * *